United States Patent [19]

Nishizawa

[11] Patent Number: 5,035,767
[45] Date of Patent: Jul. 30, 1991

[54] PROCESS FOR GROWING COMPOUND SEMICONDUCTOR MONOCRYSTAL

[75] Inventor: Junichi Nishizawa, 6-16, 1-chome, Komegafukuro, Sendai-shi, Miyagi-ken, Japan

[73] Assignees: Research Development Corporation of Japan, Tokyo; Junichi Nishizawa, Miyagi, both of Japan

[21] Appl. No.: 554,097

[22] Filed: Jul. 19, 1990

Related U.S. Application Data

[63] Continuation of Ser. No. 918,968, Oct. 15, 1986, abandoned.

[30] Foreign Application Priority Data

Oct. 16, 1985 [JP] Japan ................................ 60-228901

[51] Int. Cl.$^5$ ............................................. C30B 25/02
[52] U.S. Cl. .................................. 156/613; 156/614; 156/610; 156/DIG. 70; 156/DIG. 20; 118/715
[58] Field of Search ................ 156/614, 610, 611, 612, 156/613, DIG. 70, DIG. 20; 118/75

[56] References Cited

U.S. PATENT DOCUMENTS 4,010,045 3/1977 Ruehwein .................... 156/DIG. 70
4,250,205 2/1981 Constant et al. ............ 156/DIG. 70
4,368,098 1/1983 Manasevit ........................ 156/614

FOREIGN PATENT DOCUMENTS 1000882 6/1974 Japan .................................. 156/614

OTHER PUBLICATIONS

Article: A New Low Temperature III-V Multilayer Growth Technique: Vacuum Metalorganic Chemical Vapor Deposition.
Journal: Epitaxial Growth of GaAs by Low-Pressure MOCVD.
Nishizawa et al., J. Electrochemical Society, vol. 135(7), p. 1813 (1988).
Nishizawa et al., J. Crystal Growth, vol. 17, pp. 241–248 (1972).
Nishizawa et al., J. Crystal Growth, vol. 74, pp. 331–337 (1986).
Nishizawa et al., J. Crystal Growth, 24/25, pp. 215–219 (1974).

*Primary Examiner*—Asok Pal
*Attorney, Agent, or Firm*—Armstrong, Nikaido, Marmelstein, Kubovcik & Murray

[57] ABSTRACT

This invention relates to an improvement in a reduced gaseous phase growing method for compound semiconductor monocrystal formed from a plurality of elements such as GaAs.

A gas of compound containing each of constitutional elements is introduced into a reduced reaction pipe of which temperature distribution is controlled, without use of H$_2$ or He as a carrier gas. Thereby it is possible to control the amount of introduction of each of the elements of the compound semiconductor subjected to epitaxial growth.

In addition, the temperature distribution within the reaction pipe is controlled and the temperature of the crystal substrate is maintained at a relatively low temperature to improve the quality of the growing crystal.

13 Claims, 3 Drawing Sheets

PROCESS FOR GROWING COMPOUND SEMICONDUCTOR MONOCRYSTAL

This application is a continuation of application Ser. No. 918,968 filed Oct. 15, 1986, now abandoned.

BACKGROUND OF THE INVENTION

1. Field of the Invention

The present invention relates to a process and apparatus for growing compound semiconductor monocrystal by reduced epitaxial growth in an open-pipe process.

2. Description of the Prior Art

Gaseous phase growing methods for a compound semiconductor, for example, GaAs which is one of typical elements, so far known include chloride method, hydride method, organic metal gaseous phase growing method (MO-CVD method) and the like.

Both the chloride method and hydride method are methods not to feed gaseous components containing Ga from the exterior of a reaction pipe but normally to feed $AsCl_3$ and HCl with $H_2$ gas as a carrier gas into a reaction pipe to react with Ga within the reaction pipe and feed chloride of Ga onto the base plate to grow GaAs monocrystal.

However, both the chloride method and hydride method have the disadvantages that it is difficult to simultaneously vary a ratio between a gas component containing Ga and a gas component containing As and difficult to control the stoichiometry of GaAs crystal.

On the other hand, according to the MO-CVD method, an organic metal is used for a Ga source, and therefore, it is possible to simultaneously vary a ratio between a gas component containing Ga and a gas component containing As, as a result of which the MO-CVD method has an advantage that stoichiometry may be controlled but has a disadvantage in that the quality of crystal is inferior to that of the chloride method and hydride method.

SUMMARY OF THE INVENTION

It is therefore an object of the present invention to provide a process and apparatus for growing compound semiconductor monocrystal which can form a growth film having a high quality while overcoming the disadvantages noted above with respect to prior art.

To this end, in the open-pipe method according to the present invention, $H_2$ or He as a carrier gas is not used, and only the gas of a compound molecule containing one component element and the gas of a compound molecule containing the other component element are fed under reduced pressure into a reaction pipe independently from the exterior of the reaction pipe which is a growth chamber to thereby supply it to the surface of the GaAs base plate crystal placed within the reaction pipe to epitaxially grow the compound semiconductor monocrystal.

The apparatus according to the present invention comprises a storing portion for compound molecule gas containing one element in communication with an upstream side of a reaction pipe and a storing portion for compound molecule gas containing the other element, whereby raw gas increased in vapor pressure through a heating portion for increasing the vapor pressure of the compound molecule is supplied to the surface of the compound semiconductor base plate installed within the reaction pipe.

The temperature distribution and the flow rate of gas within the reaction pipe may he controlled to thereby control the epitaxial growth speed of the compound semiconductor.

In addition, the raw gas may be subjected to photodissociation within the reaction pipe by means of laser, high pressure mercury lamp to thereby effect the epitaxial growth at a low temperature.

DETAILED DESCRIPTION OF THE PREFERRED EMBODIMENTS

The process and apparatus for growing compound semiconductor monocrystal according to the present invention will be described with reference to the accompanying drawings.

Figure 1:
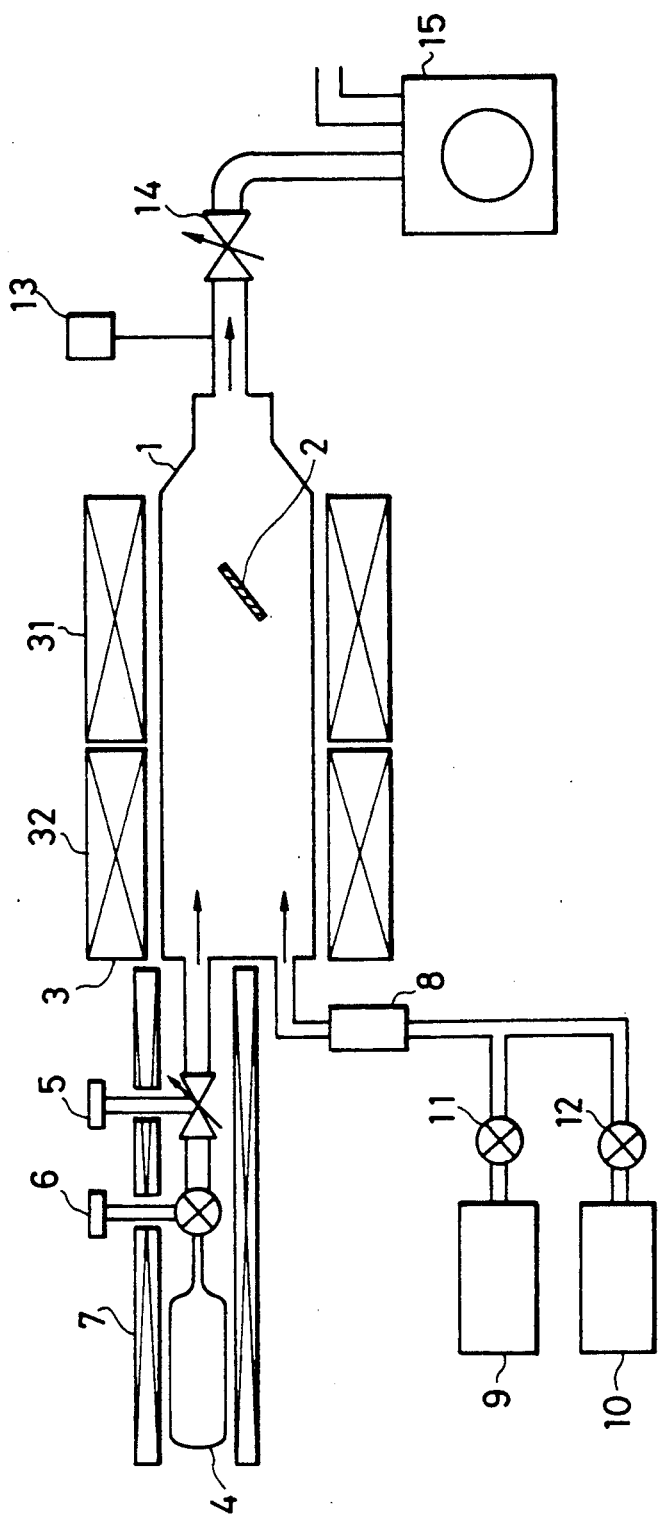
FIG. 1 is a structural view of a GaAs monocrystal growing apparatus according to a first embodiment of the present invention.

FIG. 1 shows the construction of an apparatus for growing GaAs monocrystal according to one embodiment of the present invention. This apparatus is principally composed of a reaction pipe 1 formed of quartz and having a substrate crystal 2 placed therein, an electric furnace 3 comprising a low temperature portion 31 provided in the periphery of the reaction pipe 1 to heat the crystal 2 and a high temperature portion 32 positioned upstream of the low temperature portion 31, a $GaCl_3$ (gallium trichloride) cylinder 4 in communication with the upstream side of the reaction pipe 1 through a variable flow valve 5 and a stop valve 6, an electric furnace 7 for heating the whole pipe including the cylinder 4, the valve 5 positioned at the downstream thereof and the stop valve 6, and an $AsH_3$ (arsine) gas storing portion 9 in communication with the upstream of the reaction pipe 1 through a flow meter 8 and a stop valve 11. The electric furnace 7 has a construction so that the temperature of the cylinder 4 is maintained at approximately 130° C. to heat and maintain the whole pipe including the valves 5 and 6 at approximately 150° C. The pipe at the upstream of the flow meter 8 is branched into two sections, one pipe being communicated with the gas storing portion 9 through the stop valve 11 and the other pipe being communicated with the $H_2$ gas storing portion 10 through the stop valve 12. At the downstream of the reaction pipe 1 are provided a pressure manometer 13 for monitoring pressure within the reaction pipe, a variable flow valve 14, and a rotary pump 15. With this construction, the flow of $AsH_3$ gas may be controlled independently of the flow of $GaCl_3$ vapor.

The procedure for growing the GaAs monocrystal using the aforesaid growth apparatus is similar to the normal gaseous growth under reduced pressure and is carried out as follows: The temperature of the electric furnace 3 is set to a level above the growth temperature while opening the stop valve 12 to cause a flow the $H_2$ gas from the $H_2$ gas storing portion 10 into the reaction pipe 1, to bake the reaction pipe 1. Next, the electric furnace 3 is deenergized to once cool the reaction pipe 1, into which the substrate 2 is set. When the temperature distribution of the electric furnace 3 reaches the set value while passing the H₂ gas to the reaction pipe 1 the electric furnace 3 is moved to a predetermined position, and a supply of the H₂ gas is cut off to discharge the H₂ gas from the reaction pipe 1. Then, the stop valve 11 is opened to promptly switch the H₂ gas to the AsH₃ gas, and the exhaust speed is controlled by the variable flow valve 11 to maintain the reaction pipe 1 at a set pressure. Thereafter, the stop valve 6 is opened to introduce GaCl₃ vapor to start the epitaxial growth of GaAs monocrystal.

The aforesaid operation of introducing H₂ gas is intended to bake the reaction pipe and to clean the surface of the substrate and is not essentially required for the epitaxial growth, and therefor such operation can be omitted.

Figure 2:
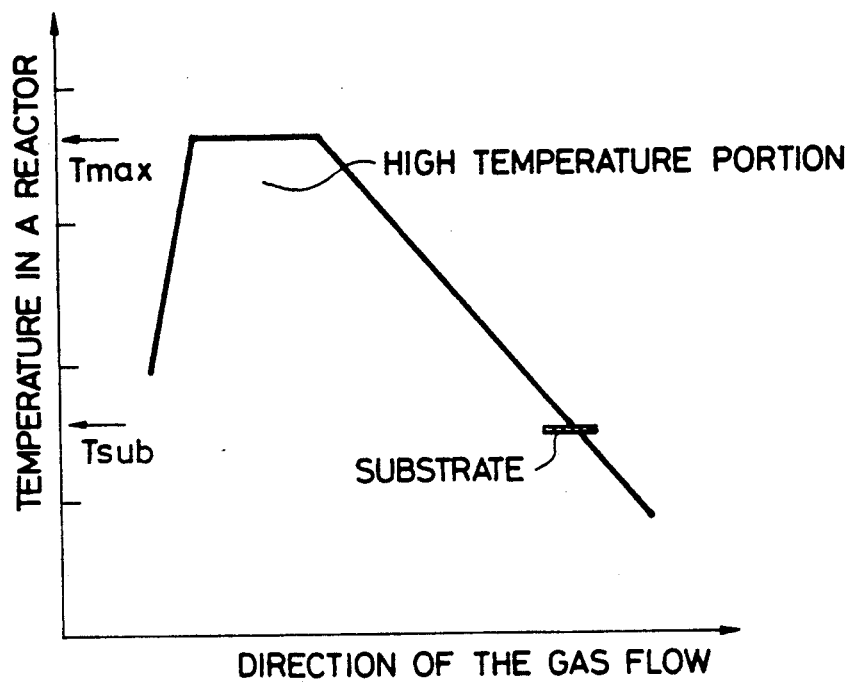
FIG. 2 is a graphic representation showing one example of temperature distributions within a reaction pipe.

FIG. 2 shows one example of the temperature distribution within the reaction pipe. Temperature T max at the high temperature portion and substrate temperature $T_{sub}$ may be suitably set by controlling electric power supplied to the high temperature portion 32 and the low temperature portion 31 of the electric furnace 3.

Figure 3:
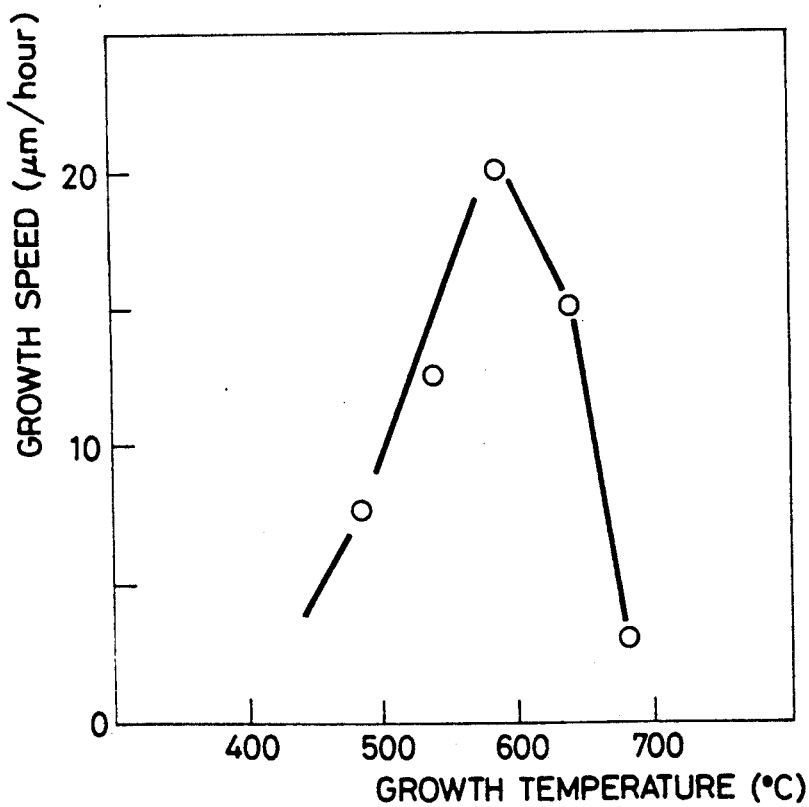
FIG. 3 is a graphic representation showing the growth speed as a function of the growth temperature.

FIG. 3 is a graph showing the growth speed obtained experimentally with the temperature of the substrate (growth temperature) while maintaining the temperature of the high temperature portion at 980° C. Here, the experiments were conducted with the flow rate of AsH₃ set to 20 cc/min., the flow rate of GaCl₃ to 0.6 cc/min., and the pressure within the reaction pipe to 40 Torr. When the growth temperature is below 700° C., the growth speed increases as the temperature of the substrate is lowered, and the growth speed is at the maximum at a temperature from 550° to 600° C. or so. At a further low temperature, the growth speed was reduced.

When the flow rate of the GaCl₃ is increased or decreased while maintaining the growth temperature at 600° C. and with other conditions set to the same as that of before, the growth speed was simply increased or decreased. When the temperature of the high temperature portion is lowered under the growth condition as described above, the growth speed decreases. It is of course true that the growth at the further low temperature may be realized by varying the growth condition.

It has been found as the result of experiments that under the conditions that the temperature of the high temperature portion is in the range of 600° to 1100° C. and the temperature of the substrate is in the range of 300° to 700° C., the monocrystal of GaAs may be subjected to the epitaxial growth.

The electric characteristics of the obtained film were that the growth temperature was in the neighborhood of 550° to 600° C., the density of impurity $5 \times 10^{15}$ cm$^{-3}$, and the mobility 35,000 cm²V$^{-1}$S$^{-1}$ (77° K.) or more.

When the growth pressure within the reaction pipe is varied with the flow rate of gas set to be constant, the growth speed slowly decreases together with pressure in the atmospheric pressure of 0.2 to 0.001 but the quality of film increases.

While in the above-described embodiment, a description has been made by use of a resistance heating electric furnace, it is to be of course noted that an infrared ray heating furnace may be used for the growth of crystal.

Furthermore, while in the aforementioned embodiment, an example has been illustrated to use a heating electric furnace for cracking GaCl₃, it is to be noted that instead, light radiation may he used to crack GaCl₃.

Figure 4:
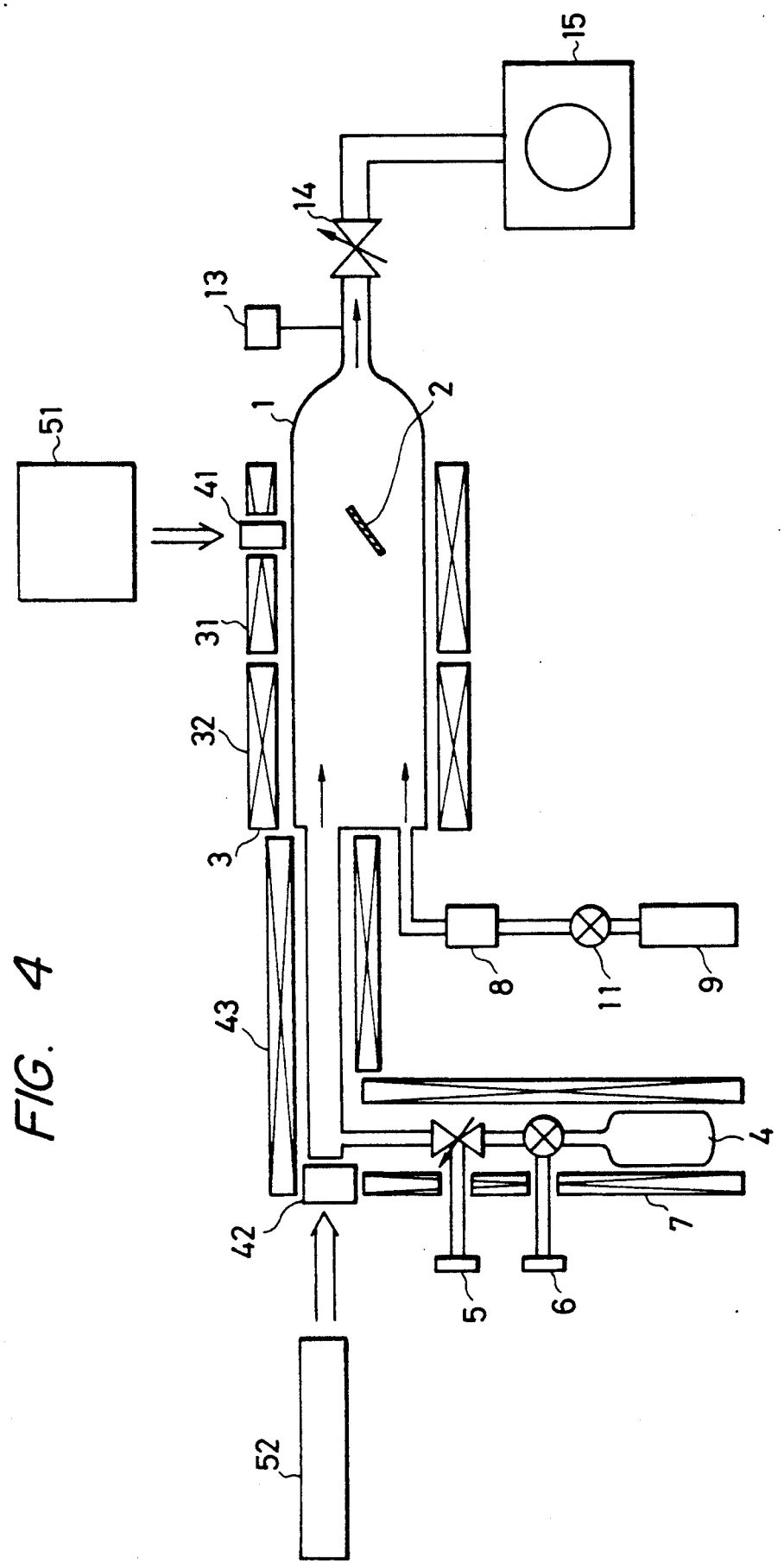
FIG. 4 is a structural view of apparatus using a photoradiation effect in a further embodiment of the present invention.

FIG. 4 shows an example in which light radiation is superimposed to heating by an electric furnace, in which parts corresponding to those shown in the embodiment of FIG. 1 are indicated by the same reference numerals as those used previously. Reference numerals 41 and 42 designate window members through which ultraviolet radiation travels, which are formed of quartz or sapphire. Reference numeral 52 designates a source of ultraviolet radiation for promoting the cracking of GaCl₃, and 249 nm light of exmalaser KrF is particularly effective therefor but other light sources may be used. Reference numeral 51 designates a high pressure mercury lamp. The window 42 can be dispensed with but is desirable to be provided so as not to disturb the temperature distribution. Reference numeral 43 denotes an electric furnace.

In the case of the cracking by light as described above, the temperature of the high temperature portion of the furnace 1 can be below 600° C., and the growth was able to be performed even at 550° C.

When the surface of the substrate is radiated by the high pressure mercury lamp 51 through the window 41 which is a plug formed from a sheet of quartz glass of which interior is sealed into vacuum for retaining the furnace at a high temperature, the reaction of the surface is promoted to render the surface smoother, and the hole mobility increases more than 20% as compared with the case where no radiation is made, thus assuring that the crystalline property is improved.

As described above, according to the process and apparatus for growing GaAs monocrystal of the present invention, it is possible to lower the growth temperature as compared with that of the conventional chloride method and hydride method, minimizing auto-doping. In addition, the growth may be maintained in a stable manner for a long period of time without relying upon the condition of the Ga source. Furthermore, it is possible to simultaneously vary the ratio between the gas component containing Ga and the gas component containing As, and possible to control the stoichiometry of GaAs crystal, as a consequence of which GaAs monocrystal of high quality can be produced. On the other hand, as compared with the MO-CVD method which is the same gaseous phase growth method as the former, a halogen compound is used and therefore GaAs monocrystal of higher quality can be produced.

Moreover, it is in principle possible not to use H₂ or He as a carrier gas, and therefore a purifying device for these carriers is not required, thus facilitating maintenance and repair and lowering the cost of apparatus.

In addition, an operation such as baking which requires a long period of time is not required before the growth as encountered in the conventional chloride method and hydride method. Particularly in the chloride method, an operation such as treatment of arsenic on the surface of Ga after baking which requires a long period of time for more than three days is required, whereas the present invention requires no such operation. The process of the invention has an advantage that the growth can be started immediately after cleaning of the reaction pipe, thus provide an extremely high industrial value.

What is claimed is:

1. An open-pipe system reduced gaseous phase growth process for preparing a semiconductor compound which comprises introducing gases from the exterior into the interior of a reaction pipe in which a monocrystal substrate is positioned, wherein said gases do not contain a carrier gas and each gas contains an element which will become part of the semiconductor compound to be formed.

2. A process according to claim 1, wherein the temperature of the substrate is lower than that of the gases.

3. A process according to claim 2, wherein one of the gases is a halide and another of the gases is a hydride.

4. A process according to claim 3, wherein the halide is $GaCl_3$ and the hydride is $AsH_3$.

5. An open-pipe system reduced gaseous phase growth process for preparing a semiconductor compound which comprises introducing gases from the exterior into the interior of a reaction pipe in which a monocrystal substrate is positioned, wherein said gases do not contain a carrier gas and each gas contains an element which will become part of the semiconductor compound to be formed, and wherein at least one of the gases being introduced into the reaction pipe is irradiated with ultraviolet light.

6. A process according to claim 5, wherein the temperature of the substrate is lower than that of the gases in the interior of the reaction pipe.

7. A process according to claim 5, wherein one of the gases is a halide and another of the gases is a hydride.

8. A process according to claim 7, wherein the halide is $GaCl_3$ and the hydride is $AsH_3$.

9. A process according to claim 5, wherein the surface of the substrate is irradiated with ultraviolet light.

10. An open-pipe system reduced gaseous phase growth process for preparing a semiconductor compound which comprises introducing gases from the exterior into the interior of a reaction pipe in which a monocrystal substrate is positioned, wherein said gases do not contain a carrier gas and each gas contains an element which will become part of the semiconductor compound to be formed, and wherein the surface of the substrate is irradiated with ultraviolet light.

11. A process according to claim 10, wherein the temperature of the substrate is lower than that of the gases in the interior of the reaction pipe.

12. A process according to claim 10, wherein one of the gases is a halide and another of the gases is a hydride.

13. A process according to claim 12, wherein the halide is $GaCl_3$ and the hydride is $AsH_3$.

* * * * *